United States Patent [19]

Mand et al.

[11] Patent Number: 4,819,048

[45] Date of Patent: Apr. 4, 1989

[54] OPTOELECTRONIC BISTABLE APPARATUS

[75] Inventors: Ranjit S. Mand, Nepean, Canada; Masaru Nakamura, Kawaguchi, Japan

[73] Assignee: Kabushiki Kaisha Toshiba, Kawasaki, Japan

[21] Appl. No.: 74,636

[22] Filed: Jul. 17, 1987

[30] Foreign Application Priority Data

Jul. 18, 1986 [JP] Japan ................................. 61-169239

[51] Int. Cl.[4] ..................... H01L 29/70; H01L 29/74; H01L 31/06

[52] U.S. Cl. ......................................... 357/17; 357/16; 357/30; 357/34; 357/38; 357/37; 372/43; 372/45; 372/50

[58] Field of Search ...................... 357/30 E, 30 P, 17, 357/16, 37, 38, 34; 372/43, 45, 50

[56] References Cited

U.S. PATENT DOCUMENTS 4,534,033  8/1985  Nishizawa et al. .................... 357/17
4,599,632  7/1986  Bethea et al. .......................... 357/16

FOREIGN PATENT DOCUMENTS 1385818  3/1975  United Kingdom .

OTHER PUBLICATIONS

"A New Double Heterostructure Optoelectronic Switching Device Using Molecular Beam Epitaxy"; Taylor, G. W., et al, J. Appl. Phys. 59(2) pp. 596-600 (1986).

"Dynamic Switch Logic–A New Concept for Digital Optical Logic Using DOES Devices"; Taylor, G. W., et al, Presented at IEDM 1985, pp. 645-657.

Primary Examiner—Andrew J. James
Assistant Examiner—Jerome Jackson, Jr.
Attorney, Agent, or Firm—Oblon, Fisher, Spivak, McClelland & Maier

[57] ABSTRACT

An optoelectronic bistable apparatus having a double heterojunction structure comprising a light-emitting first semiconductor layer of n type GaAs interlaid between a second semiconductor layer of n$^-$ type AlGaAs and a third semiconductor layer of p$^+$ type AlGaAs, the second and third semiconductor layers having a broader energy gap than that of the first semiconductor layer. An extremely thin fourth semiconductor layer of p$^+$ type GaAs with a high impurity concentration is deposited on the second semiconductor layer. A fifth semiconductor layer of n$^-$ type AlGaAs, n$^+$ type AlGaAs and n$^+$ type GaAs is formed on the fourth semiconductor layer. At least a portion of the fifth semiconductor layer which contacts the fourth semiconductor layer has a broader energy gap than that of the second semiconductor layer.

10 Claims, 5 Drawing Sheets

OPTOELECTRONIC BISTABLE APPARATUS

BACKGROUND OF THE INVENTION

This invention relates to an optoelectronic bistable apparatus.

More advanced development of optoelectronic devices and elements which include semiconductor lasers and light-emitting diodes is expected to lead to new production of photocomputers and photoexchangers. In particular the optoelectronic bistable unit is attracting enthusiastic research and development. An optoelectronic bistable apparatus has certain indispensable properties. First, the apparatus should have an element structure which ensures planar light emission in order to enable, for example, a photocomputer to carry out the parallel processing of optical signals in as small an area as possible. Second, the apparatus should have a light-amplifying function so as to permit connection of the elements in series; and thirdly that the apparatus should manifest a quick response capability.

Conventional bistable elements are described in "Dynamic Switch Logic—A New Concept for Digital Optical Logic Using DOES Devices", IEDM 85, pp 654–657 by G. W. Taylor et al., and "A new double heterostructure optoelectronic switching device using molecular beam epitaxy", J. Appl. Phys. 59(2), 15, January 1986, pp. 596–600 by the same authors. These proposed bistable elements are of the planar light-emitting type, and are characterized in that parallel processing can be easily carried out; they have a light-amplifying function, thus practically satisfying the fundamental requirements; further they are provided with an auxiliary electrode which achieves a high degree of element control.

However, the aforementioned elements still leave many problems unsolved. One of the problems accompanying the proposed devices is that since the light-emitting n type GaAs layer directly contacts an extremely thin p+type GaAs layer of a high impurity concentration, the interface property of the n type GaAs layer is deteriorated. As a result, non-light-emitting recombination frequently takes place in an interface between the n type GaAs layer and the p+type GaAs layer. This undesirable recombination obstructs the elevation of a light-emitting property.

Another problem with the aforesaid devices regards the placing of an auxiliary electrode. The auxiliary electrode is provided to control the height of a potential barrier prepared from an extremely thin p+type GaAs layer. Fundamentally, therefore, it is preferred that the auxiliary electrode be directly ohmic-contacted to the p+type GaAs layer. Since, however, the p+type GaAs layer is extremely thin, it is impossible to mount auxiliary on the p+type GaAs layer. Unavoidably, therefore, the auxiliary electrode is mounted on the light-emitting n type GaAs layer. Consequently the aforementioned bistable devices fail to exhibit quick response characteristics because of the above-mentioned undesirable location of the auxiliary electrode.

SUMMARY OF THE INVENTION

An object of the invention is to provide an optoelectronic bistable element capable of ensuring a high output and quick response.

To obtain the above-mentioned object, this invention provides an optoelectronic bistable element which comprises:

a first semiconductor layer of a first conductivity type, for emitting a light;

a second semiconductor layer of the first conductivity type which has a broader energy gap than that of the first semiconductor layer and is formed on one side of the first semiconductor layer;

a third semiconductor layer of a second conductivity type which has a broader energy gap than that of the first semiconductor layer and is formed on the other side of the first semiconductor layer, the first semiconductor layer being interposed between the second and third semiconductor layers so as to provide a double heterojunction structure;

an extremely thin fourth semiconductor layer of second conductivity type, which is formed on the second semiconductor layer, with a high impurity concentration;

a fifth semiconductor layer of the first conductivity type formed on the fourth semiconductor layer;

a first main electrode formed on the third semiconductor layer; and a second main electrode formed on the fifth semiconductor layer.

The optoelectronic bistable element embodying the present invention differs from the conventional type in that the light-emitting first semiconductor layer does not contact the extremely thin fourth semiconductor layer having a high impurity concentration; but the second semiconductor layer is interposed as a clad layer between the light-emitting layer and the extremely thin layer.

An optoelectronic bistable element of this invention constructed as mentioned above offers the advantages that nonluminous recombination centers are reduced in the light-emitting interface, thereby improving the output property of an optoelectronic bistable element of the double heterojunction structure.

Another optoelectronic bistable element of the invention comprises:

a light-emitting a first semiconductor layer of a first conductivity type;

a second semiconductor layer of the first conductivity type which has a broader energy gap than that of the first semiconductor layer and is formed on one surface of the first semiconductor layer;

a third semiconductor layer of a second conductivity type which has a broader energy gap than that of the first semiconductor layer, and is formed on the other surface of the first semiconductor layer, the first semiconductor layer being interposed between the second and third semiconductor layers so as to provide a double heterojunction structure;

an extremely thin fourth semiconductor layer of the second conductivity type which is formed on the second semiconductor layer with a high impurity concentration;

a fifth semiconductor layer of the first conductivity type formed on the fourth semiconductor layer;

a first main electrode formed on the third semiconductor layer;

a second main electrode formed on the fifth semiconductor layer; and an auxiliary electrode mounted on the fourth semiconductor layer for directly supplying the fourth semiconductor layer with voltage and for controlling the potential barrier of said fourth semiconductor layer.

Another optoelectronic bistable element according to the present invention is characterized in that the auxiliary electrode is directly connected to the fourth semiconductor layer; the second semiconductor layer is interposed between the light-emitting first semiconductor layer and the extremely thin fourth semiconductor layer, thus making it practical to mount an auxiliary electrode on the fourth semiconductor layer; those portions of the second and fifth semiconductor layers which contact the fourth semiconductor layer contain a lower impurity concentration than that of the fourth semiconductor layer; and the height of the potential barrier can be directly controlled by the auxiliary electrode, thereby ensuring the greater acceleration of the switching operation.

BRIEF DESCRIPTION OF THE DRAWINGS

Other objects and advantages will be apparent from the following description taken in conjunction with the accompanying drawings in which.

DETAILED DESCRIPTION OF THE PREFERRED EMBODIMENTS

Figure 1:
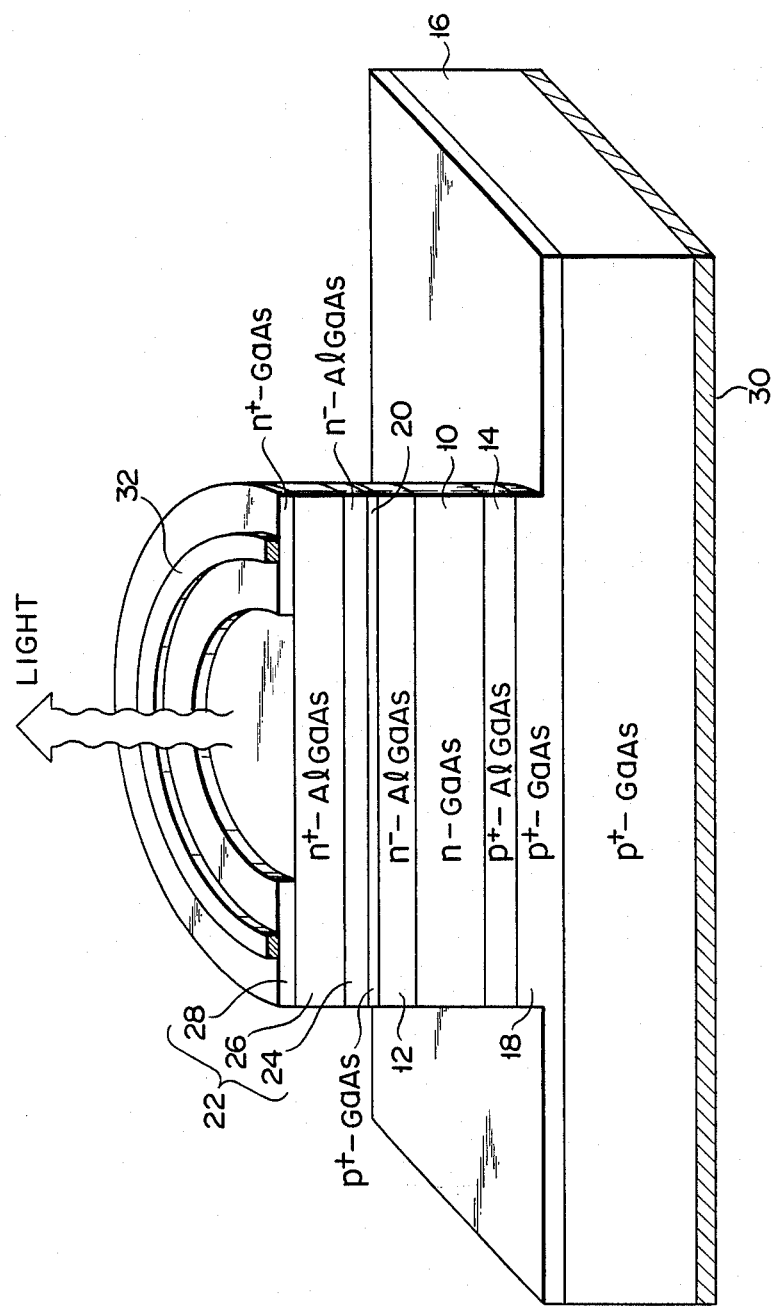
FIG. 1 is an oblique sectional view of an optoelectronic bistable apparatus according to a first embodiment of the present invention.
Figure 2:
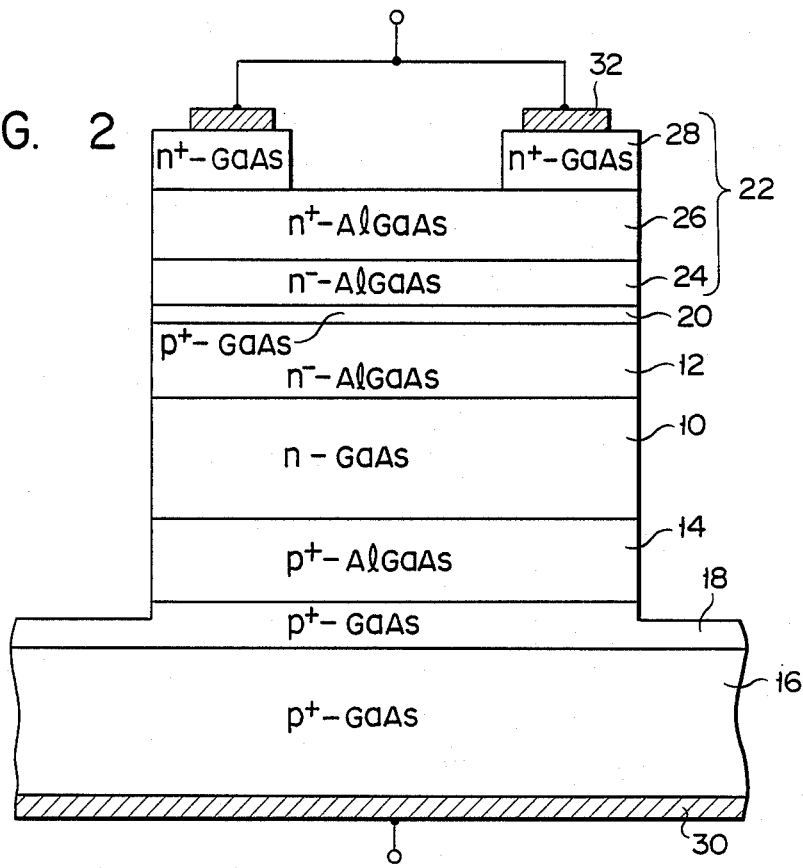
FIG. 2 is a cross section of the first embodiment.

Description may now be made with reference to FIGS. 1 and 2 of an optoelectronic bistable device according to a first embodiment of the present invention. Reference numeral 10 represents a light-emitting n type GaAs semiconductor layer having a thickness of about 1 micron. Mounted on one side of GaAs layer 10 is n−type AlGaAs layer 12 having a broader energy gap (forbidden band gap) that of GaAs layer 10. Formed on the other side of GaAs layer 10 is p+type AlGaAs layer 14 having a broader energy gap than that of GaAs layer 10. Both n−type AlGaAs layer 12 and p+AlGaAs layer 14 act as clad layers for continuing carriers. N−type AlGaAs layer 12 has a thickness of 4800 Å, and p+type AlGaAs layer 14 has a thickness of 3500 Å. N type GaAs layer 10, n−type AlGaAs layer 12 and p+AlGaAs layer 14 jointly constitute a double heterojunction structure. This double heterojunction structure is provided above p+type GaAs substrate 16 with p+type GaAs buffer layer 18 interposed therebetween. Deposited on n−type AlGaAs layer 12 is extremely thin p+type GaAs layer 20 with a thickness of about 40 Å and an impurity concentration of $5 \times 10^{18}/cm^3$. Deposited on p+type GaAs layer 20 is n type semiconductor layer 22 which comprises n−type AlGaAs layer 24 contacting p+type GaAs layer 20, n+type AlGaAs layer 26 mounted on n−type AlGaAs layer 24, and n+type GaAs layer 28 deposited on n+type AlGaAs layer 26. N−type AlGaAs layer 24, p+type GaAs layer 20 and n−type AlGaAs layer 12 collectively constitute a potential barrier, giving rise to a bistable action. N+type AlGaAs layer 26 and n+type GaAs layer 28 jointly function as an emitter for supplying electrons. N−AlGaAs layer 24 has a thickness of about 800 Å, and n+type AlGaAs layer 26 has a thickness of about 4000 Å. P+type GaAs layer 20 is sandwiched between n−type AlGaAs layers 12, 24, both of which have a low impurity concentration of about $5 \times 10^{15}/cm^3$.

The above mentioned semiconductor layers are all fabricated by the molecular beam epitaxial process at a growth-temperature of about 700° C. Anode electrode 30 is fitted to the backside of p+type GaAs substrate 16. Cathode electrode 32 is mounted on n+type GaAs layer 28.

Figure 3:
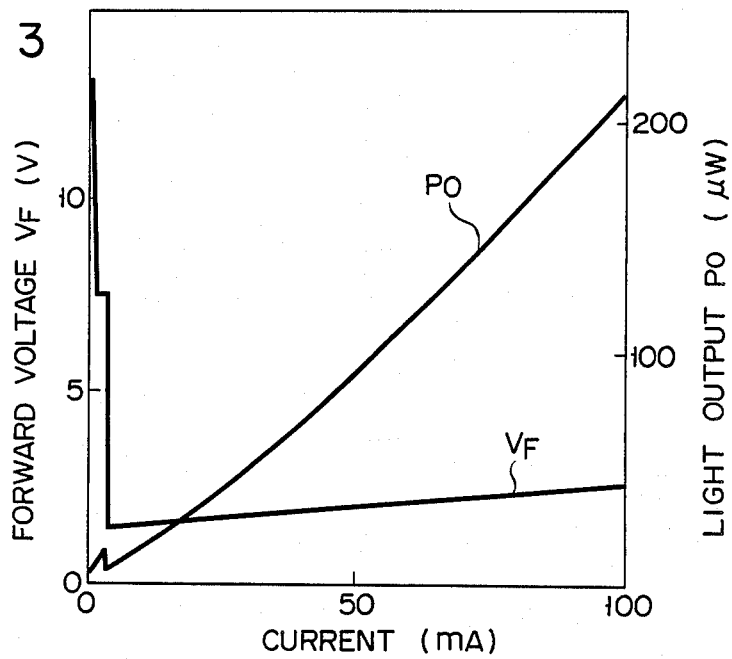
FIG. 3 diagramatically indicates the relationship between the magnitude of current and the level of forward voltage and the relationship between the magnitude of current and the light output as observed in the first embodiment.

FIG. 3 diagramatically indicates a property of an optoelectronic bistable apparatus constructed as mentioned above. The left side ordinate indicates the level of forward voltage. The forward voltage is defined as a level of voltage applied between electrodes 32, 30 with electrode 30 taken as positive. The abscissa represents the magnitude of a current. The right side ordinate represents a eight output. While the forward voltage ($V_F$) stands at 13 volts, the apparatus remains nonconductive (first stable state). When the forward voltage exceeds 13 volts, current suddenly flows through the element, which is thus rendered conductive (second stable state). Once the element is kept conductive, this conductive state is sustained even if the voltage is allowed to drop below several volts. Experiments indicate that when current of 100 mA ran through the element, the light output was a higher value than 200 microwatts. The conventional optoelectronic bistable apparatus proposed by G. W. Taylor et al. in "A new double heterostructure optoelectronic switching device using molecular beam epitaxy" showed that when current has a magnitude of 100 mA, the resultant light output stood at about 30 microwatts. A difference between the light output of over 200 microwatts attained by the device of the present invention and the light output of about 30 microwatts observed in the device proposed by G. W. Taylor et al. results from the fact that in the present invention n−type AlGaAs layer 12 of low impurity concentration which to acts as a clad layer is interposed between light-emitting n type GaAs layer 10 and p+type GaAs layer 20. Consequently, the optoelectronic bistable apparatus of the present invention offers the advantages that the light-emitting layer is improved in the interface property, thus ensuring a high light output.

A feature of the optoelectronic bistable apparatus in the present invention is that clad layer 12 is interposed between light-emitting layer 10 and extremely thin semiconductor layer 20 of high impurity concentration. Improvement of response speed with respect to the above-mentioned structure can advisably be realized by the following step. Referring, for example, to n−type AlGaAs layers 12, 24 clamping p+type GaAs layer 20, it is preferable to define the composition ratio of Al-Ga-As such that upper AlGaAs layer 24 has a broader energy gap than lower AlGaAs layer 12. This structure facilitates the injection of electrons from the emitter and ensures the quicker response of the subject optoelectronic bistable apparatus.

It is also advisable to define the composition ratio of Al-Ga-As in such a manner that the energy gap of lower AlGaAs layer 12 is rendered progressively broader from the side of light-emitting GaAs layer 10. This arrangement offers the advantage that when the subject apparatus is changed from the conducting state (ON state) to the nonconducting state (OFF state), holes can move out from light-emitting layer 10 with greater ease, thereby ensuring the quicker response of light output.

Further, p+type GaAs layer 20 should have a high impurity concentration and p+type GaAs layer 20 should be completely depleted with no bias voltage applied. These conditions are required for the purpose of raising the height of the potential barrier of a region constituted by p+type GaAs layer 20 and AlGaAs layers 12, 24 to ensure the perfect switching operation and to minimize the accumulation of minor carriers which tend to deteriorate the switching response. To satisfy the above-mentioned requirements, p+type GaAs layer 20 may have a higher impurity concentration than $10^{18}/cm^3$ and have its thickness reduced to below 200 Å.

To accelerate the movement of carriers, it is desirable that the impurity concentration of AlGaAs layers 12, 24 be kept below $10^{16}/cm^3$.

Figure 4:
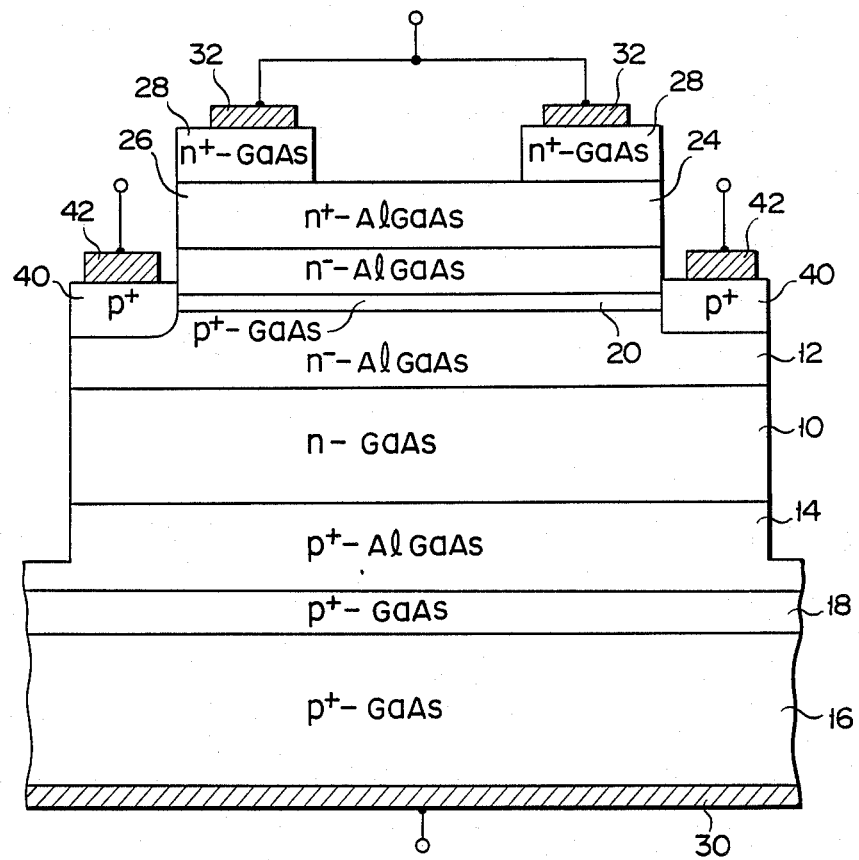
FIG. 4 is a cross section of an optoelectronic bistable apparatus according to a second embodiment of the present invention.

Description may now be made with reference to FIG. 4 of an optoelectronic bistable apparatus according to a second embodiment of the present invention. FIG. 4 illustrates an optoelectronic bistable apparatus provided with an auxiliary electrode. The embodiment of FIG. 4 has the same fundamental structure as that of FIGS. 1 and 2. Therefore, the same parts of FIG. 4 the same as those of FIGS. 1 and 2 are denoted by the same numerals, detailed description thereof being omitted. The apparatus of FIG. 4 differs from that of FIGS. 1 and 2 as described below. Masa-etching is performed from a part of GaAs layer 28 to a part of AlGaAs layer 24.

Later, an impurity such as Zn is diffused from the etched surface of n−type AlGaAs layer 24 into this layer 24, p+type GaAs layer 20 and n−type AlGaAs layer 12, thereby providing p+type semiconductor layer 40. Auxiliary electrode 42 is deposited on p+type semiconductor layer 40.

The embodiment of FIG. 4 has substantially the same characteristic as the embodiment of FIGS. 1 and 2. With the embodiment of FIG. 4, the height of the potential barrier can be controlled by varying the level of the voltage on auxiliary electrode 42, thus controlling the switching property of the subject optoelectronic bistable apparatus. To attain this object, n−type AlGaAs layers 12, 24 clamping p+type GaAs layer 20 may be sufficiently reduced in impurity concentration in order to fully minimize any leak current between p+type semiconductor layer 40 and n−type AlGaAs layers 12, 24. The above-mentioned structure substantially achieves the same effect as that which would be attained when auxiliary electrode 42 contacts p+type GaAs layer 20, thereby effectively controlling the potential barrier height of p+GaAs layer 20.

In the case of the second embodiment of FIG. 4, it is preferred that the same care be taken in connection with the energy gap width of n−type AlGaAs layers 12, 24 and the thickness and impurity concentration of p+type GaAs layer as those which were required for the first embodiment in order to realize the quick response property of the subject optoelectronic bistable apparatus.

Figure 5:
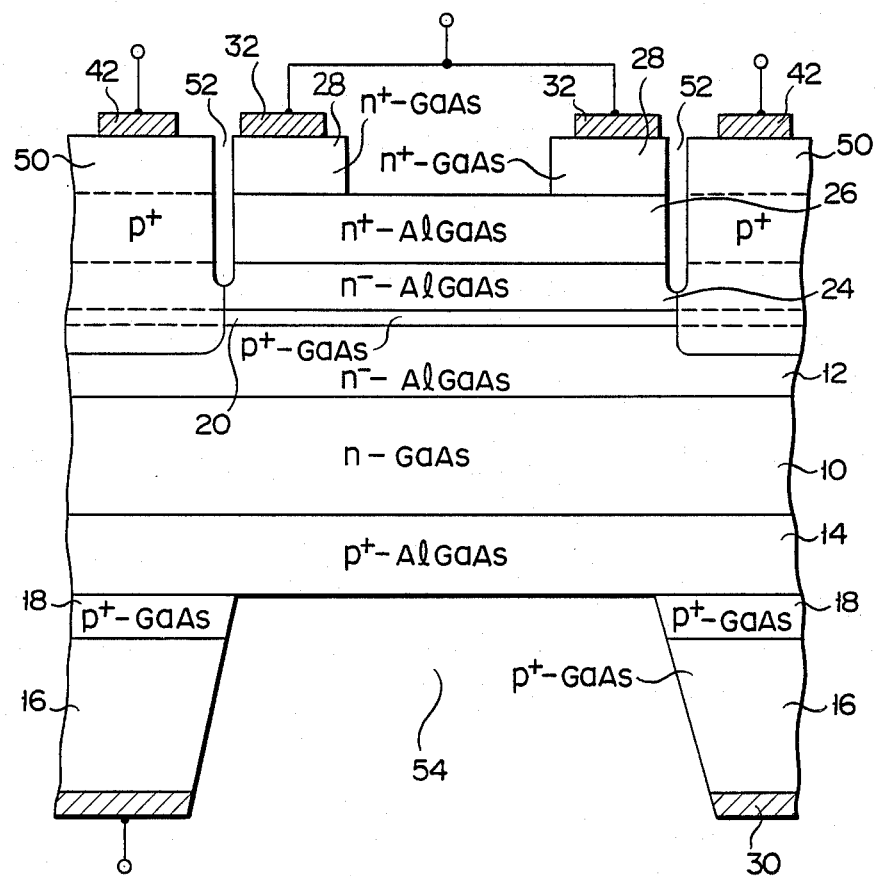
FIG. 5 is a present cross section of a third embodiment of the invention.

Description may now be made with reference to FIG. 5 of an optoelectronic bistable apparatus according to a third embodiment of the present invention. FIG. 5 is a modification of the optoelectronic bistable element of FIG. 4. In FIG. 5, Zn is diffused to a great depth from the top surface of n+type GaAs layer 28. P+type semiconductor layer 50 is formed so as to reach p+type GaAs layer 20. Emitter layers 26, 28 are respectively isolated from p+type semiconductor layer 50 by narrow groove 52. Light-emitting opening 54 is provided by partly etching the contrast part of p+type GaAs substrate 16 and p+type GaAs buffer layer 18. In other respects, FIG. 5 has substantially the same structure as FIG. 4. The same parts of FIG. 5 the same as those of FIG. 4 are denoted by the same numerals, a detailed description thereof being omitted.

The third embodiment of FIG. 5 ensures the amplified relay of a light signal. Namely, when the optoelectronic bistable apparatus of FIG. 5 is biased to a state immediately before the ON state, even a slight amount of light beams entering the apparatus from above renders the apparatus conductive, thereby enabling a large volume of light to be obtained from opening 54. In the embodiment of FIG. 5, light beams are carried into and out of the substrate wafer in a perpendicular direction to the substrate wafer, ensuring the vertical connection of a light signal at a short distance.

Figure 6:
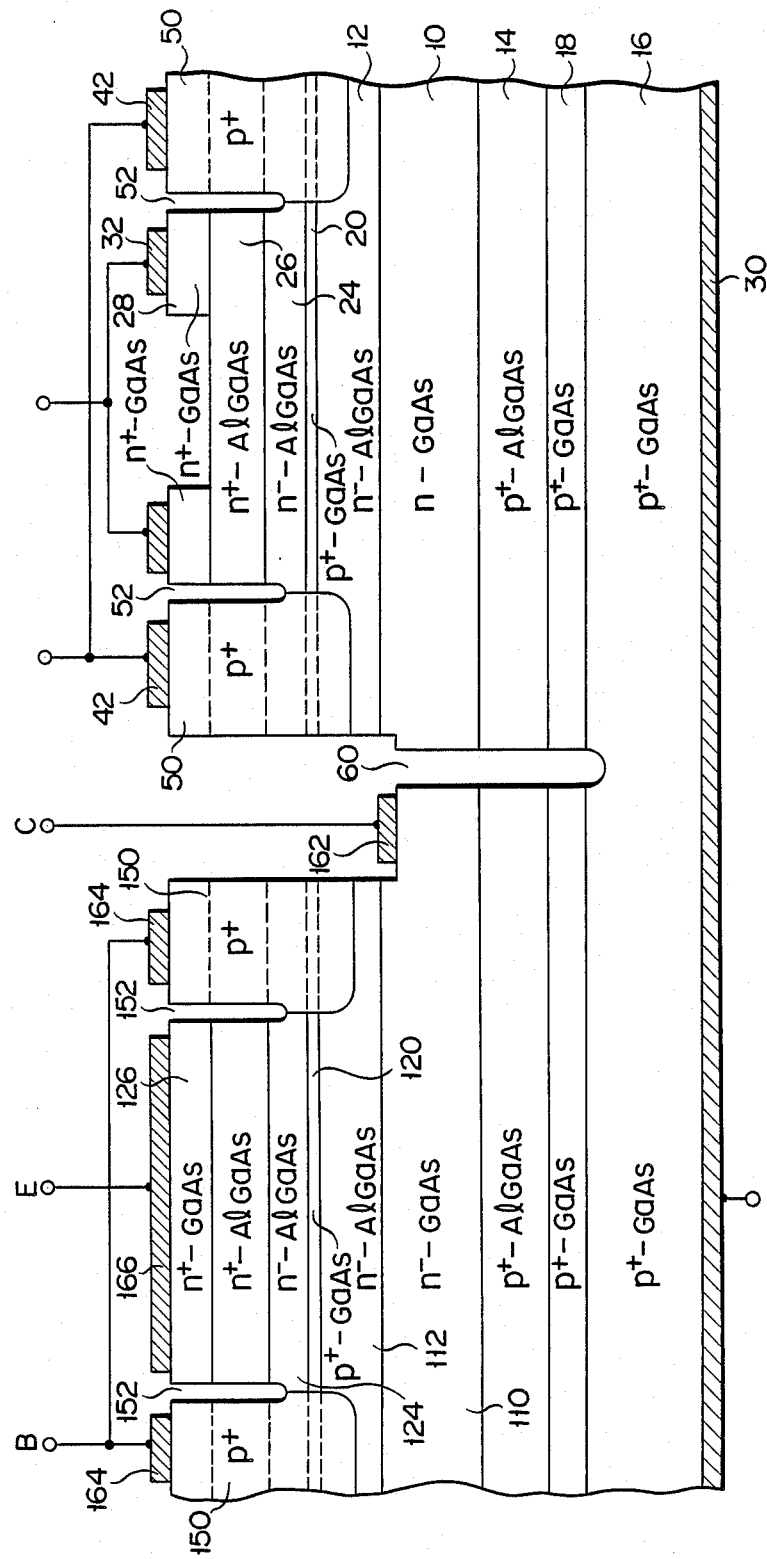
FIG. 6 is a present cross section of a fourth embodiment of the invention.

Description may now be made with reference to FIG. 6 of an optoelectronic bistable apparatus according to a fourth embodiment of the invention. In the fourth embodiment, an optoelectronic bistable element is formed integrally with a transistor. The section on the right side of element-isolating groove 60 shown in FIG. 6 represents an optoelectronic bistable element. The optoelectronic bistable element of FIG. 6 has substantially the same structure as that of FIG. 5 except that opening 54 of FIG. 5 is not provided in FIG. 6. Therefore, the same parts of FIG. 6 the same as those of FIG. 5 are denoted by the same numerals, description thereof being omitted. The section on the left side of element-isolating groove 60 has exactly the same laminated structure as the right side section, representing a heterobipolar transistor. Referring to the section on the left side of element-isolating groove 60, p+type GaAs layer 120 represents a base region; n−type AlGaAs layer 124 denotes an emitter region; and n−type AlGaAs layer 112 shows a collector region. Collector electrode 162 having terminal C is deposited on n−type GaAs layer 110. Base electrode 164 having terminal B is deposited on p+type semiconductor layer 150 fabricated by the deep diffusion of Zn. Voltage supplied to base electrode 164 is further delivered to p+type GaAs layer 120 through p+type semiconductor layer 150. Since the transistor does not require any input and output of light beams, emitter electrode 166 having terminal E is deposited on the substantially whole top surface of n+GaAs layer 126.

The fourth embodiment of FIG. 6 ensures the integral fabrication of both optoelectronic bistable element and transistor with substantially no change in the process of manufacturing an optoelectronic bistable apparatus, thereby realizing the fabrication of a large-scale photoelectronic integrated circuit.

What is claimed is:
1. An optoelectronic bistable apparatus comprising:
 a light-emitting first semiconductor layer of a first conductivity type;
 a second semiconductor layer of the first conductivity type which has a broader energy gap than that of the first semiconductor layer and is formed on one side of the first semiconductor layer;

a third semiconductor layer of a second conductivity type which has a broader energy gap than that of the first semiconductor layer and is formed on the other side of the first semiconductor layer, the first semiconductor layer being interposed between the second and third semiconductor layers to provide a double heterojunction structure;

an extremely thin fourth semiconductor layer of the second conductivity type, which is formed on the second semiconductor layer, with a high impurity concentration;

a fifth semiconductor layer of the first conductivity type which is formed on the fourth semiconductor layer, at least a portion of the fifth semiconductor layer, which contacts the fourth semiconductor layer, having a broader energy gap than that of the second semiconductor layer;

a first main electrode formed on the third semiconductor layer, and a second main electrode formed on the fifth semiconductor layer.

2. The optoelectronic bistable apparatus according to claim 1, wherein:

the energy gap of the second semiconductor layer has its width rendered progressively broader from the side of the first semiconductor layer to the side of the fourth semiconductor layer.

3. The optoelectronic bistable apparatus according to claim 1, wherein:

the fourth semiconductor layer has higher impurity concentration than $10^{18}/cm^3$; and those portions of the second and fifth semiconductor layers which contact the fourth semiconductor layer have a lower impurity concentration than $10^{16}/cm^3$.

4. The optoelectronic bistable apparatus according to claim 1, wherein:

the fourth semiconductor layer has such a thickness as is depleted under the condition when no bias voltage is impressed.

5. The optoelectronic bistable apparatus according to claim 1, wherein:

the fourth semiconductor layer has a smaller thickness than 200 Å.

6. An optoelectronic bistable apparatus comprising:

a light-emitting first semiconductor layer of a first conductivity type;

a second semiconductor layer of the first conductivity type which has a broader energy gap than that of the first semiconductor layer and is formed on one side of the first semiconductor layer;

a third semiconductor layer of a second conductivity type which has a broader energy gap than that of the first semiconductor layer and is formed on the other side of the first semiconductor layer, the first semiconductor layer being interposed between the second and the third semiconductor layers to provide a double heterojunction structure;

an extremely thin fourth semiconductor layer of the second conductivity type, which is formed on the second semiconductor layer, with a high impurity concentration;

a fifth semiconductor layer of the first conductivity type which is formed on the fourth semiconductor layer, at least a portion of the fifth semiconductor layer, which contacts the fourth semiconductor layer, having a broader energy gap than that of the second semiconductor layer;

a first main electrode formed on the third semiconductor layer;

a second main electrode formed on the fifth semiconductor layer; and an auxiliary electrode, connected to the fourth semiconductor layer, for supplying the fourth semiconductor layer with voltage and controlling the potential barrier height of the fourth semiconductor layer.

7. The optoelectronic bistable apparatus according to claim 6, wherein:

the energy gap of the second semiconductor layer has its width rendered progressively broader from the side of the first semiconductor layer to the side of the fourth semiconductor layer.

8. The optoelectronic bistable apparatus according to claim 6, wherein:

the fourth semiconductor layer has a higher impurity concentration than $10^{18}/cm^3$; and those portions of the second and fifth semiconductor layers which contact the fourth semiconductor layer have a lower impurity concentration than $10^{16}/cm^3$.

9. The optoelectronic bistable apparatus according to claim 6, wherein:

the fourth semiconductor layer has its thickness depleted while no bias voltage is impressed.

10. The optoelectronic bistable apparatus according to claim 6, wherein:

the fourth semiconductor layer has a smaller thickness than 200 Å.

* * * * *